(12) United States Patent
Kim (10) Patent No.: US 8,717,059 B2
(45) Date of Patent: May 6, 2014

(54) DIE HAVING WIRE BOND ALIGNMENT SENSING STRUCTURES

(75) Inventor: Changduk Kim, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 280 days.

(21) Appl. No.: 13/222,744

(22) Filed: Aug. 31, 2011

(65) Prior Publication Data

US 2013/0049789 A1 Feb. 28, 2013

(51) Int. Cl.
*G01R 31/02* (2006.01)

(52) U.S. Cl.
USPC ..................................... 324/762.01

(58) Field of Classification Search
USPC .......... 324/762.01–762.1; 257/676, E23.039, 257/E23.052; 438/617
See application file for complete search history.

(56) References Cited

U.S. PATENT DOCUMENTS

| | | | |
|---|---|---|---|
| 5,764,366 A * | 6/1998 | Nguyen et al. ............... | 356/401 |
| 6,465,898 B1 * | 10/2002 | Hnilo et al. .................. | 257/797 |
| 6,593,168 B1 * | 7/2003 | Ehrichs et al. ............... | 438/108 |
| 6,789,240 B2 * | 9/2004 | Koduri ............................ | 716/51 |
| 2005/0269713 A1 * | 12/2005 | Oh et al. ........................ | 257/777 |
| 2008/0182120 A1 | 7/2008 | Tan et al. | |
| 2009/0108425 A1 | 4/2009 | Lee et al. | |

* cited by examiner

*Primary Examiner* — Jermele M Hollington
*Assistant Examiner* — Demetrius Pretlow
(74) *Attorney, Agent, or Firm* — Steven A. Shaw; Wade James Brady, III; Frederick J. Telecky, Jr.

(57) ABSTRACT

A semiconductor die includes a substrate having a topside including active circuitry having an array of bond pads thereon separated by gaps including a minimum gap. At least a portion of the array of bond pads are connected to nodes in the active circuitry. At least one wire bond alignment sensing structure includes a first bond pad selected from the array of bond pads, and a guard element positioned along at least a portion of the first bond pad. The guard element is spaced apart by a distance shorter than the minimum gap from the first bond pad.

20 Claims, 9 Drawing Sheets

FIG. 4B

DIE HAVING WIRE BOND ALIGNMENT SENSING STRUCTURES

FIELD

Disclosed embodiments relate to semiconductor die including bond pads for wirebonding, and wirebonded semiconductor assemblies.

BACKGROUND

Wire bonding is one method for semiconductor assembly. The wire bonding flow includes three primary steps, die attach, wire bond and encapsulation. The wire bond process electrically connects the bond pads on the semiconductor die to pads, leads or pins on the workpiece. The wire bond machine essentially welds a fine metal wire between each bond pad on the die and the appropriate pad, lead or pin on the workpiece.

During the assembly of wire bound semiconductor devices, the wire bonding can be misaligned (or shifted) from the center of the bond pads. Die having misaligned wire bonds may still pass final electrical test when the degree of misalignment is such that the respective bond pads or their conductive material thereon approach one another, but do not touch. However, such die can become potential (latent) shorts. For example, if die having substantially misaligned wire bonds (e.g. wire bonds near the edge of the bond pads) receives burn-in stress or is used in the field, the misaligned wire bonds can become further displaced, and/or metal on the bond pad can become displaced, sometimes sufficient to create a bridge that shorts between adjacent bond pads.

Microscope inspection of the wire bonding after burn-in (e.g., 168 hours at 125° C.) can be performed (e.g., 40× optical microscope) in an attempt to screen out latent shorts. However, this method is not compatible with mass production, and has trouble detecting misaligned bond wires, particularly if the bond pads and bond pad pitch are small. Thus, microscope inspection may not detect all wire bond shorts between adjacent bond pads, or latent shorts. Even electrical test after burn-in will not detect latent shorts. Accordingly, die having shorts after burn-in or latent shorts between bond pads can pass final test and thus be sold to customers, which can manifest as failures first identified by the customers.

SUMMARY

Disclosed embodiments describe semiconductor die that include one or more electrical test structures referred to herein as "wire bond alignment sensing structures" that solve the problem of latent shorts associated with wire bonded die. "Latent shorts" as use herein refers to die having bond wire misalignment on the bond pads that are not detectable as rejects during the assembly process including final test, but can fail due to leakage or shorts between bond pads at a later time. Disclosed embodiments recognize that misaligned wire bonds can snowplow metal from a bond pad towards an adjacent pad, but short of touching the adjacent bond pad. During burn-in or during the life of the device in the field, the snowplowed metal can reform and reach an adjacent bond pad, resulting in a electrical short (or significant leakage) between the respective bond pads, which can render the device non-functional. Such latent shorts are detectable by disclosed wire bond alignment sensing structures which are configured to be more sensitive to bond wire misalignment as compared to the minimum spaced conventional bond pads on the die.

Disclosed semiconductor die comprises an array of bond pads on the die that have a minimum gap therebetween, and at least one wire bond alignment sensing structure thereon. The wire bond alignment sensing structure includes a first bond pad selected from the array of bond pads, and a guard element positioned along at least a portion of the first bond pad. The guard element is spaced apart by a distance from the first bond pad that is shorter than the minimum gap to provide heightened sensitivity to bond wire misalignment.

DETAILED DESCRIPTION

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Figure 1A:
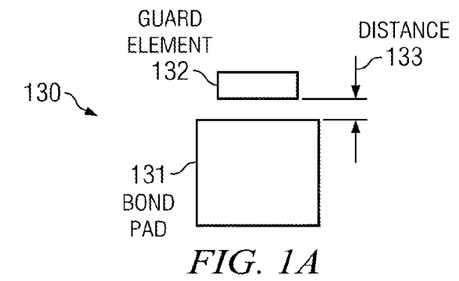
FIGS. 1A-E depict various wire bond alignment sensing structures, according to example embodiments.

FIGS. 1A-E depict various wire bond alignment sensing structures that are designed for use on production semiconductor die that are wire bonded to a workpiece, according to example embodiments. FIG. 1A depicts a wire bond alignment sensing structure 130 that includes a bond pad 131 selected from an array of bond pads on the semiconductor die (see FIGS. 2A-D for example semiconductor die), and a guard element 132 positioned along at least a portion of the first bond pad 131. The bond pad 131 and the guard element 132 are both generally formed from metal from same metal interconnect level, such as top level copper or aluminum (e.g., aluminum/copper).

The guard element 132 is spaced apart by a distance 133 that is shorter than the minimum gap between bond pads in the array of bond pads from the first bond pad 131 on the die. This distance 133 being shorter than the minimum gap between bond pads in the array of bond pads from the first bond pad 131 on the die allows bond wire misalignment-based latent shorts to be detectable by disclosed wire bond alignment sensing structures at final test that would not be otherwise detectable at final test. As used herein the "minimum gap between bond pads in the array" refers to the arrangement where there are two or more bond pad to adjacent bond pad spacings provided on the die, such as 40 µm and 45 µm, in which case 40 µm would be the minimum gap between bond pads in the array on the die.

Figure 1B:
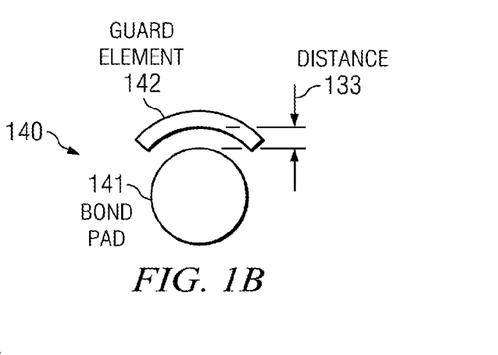

FIG. 1B depicts a wire bond alignment sensing structure 140 that includes a bond pad 141 shown as a circular bond pad selected from an array of circular bond pads on the semiconductor die, and a guard element 142 positioned along a portion of the bond pad 141. Besides rectangular and circular bond pads, disclosed embodiments generally include all other bond pad shapes, such as octagon, for example.

Figure 1C:
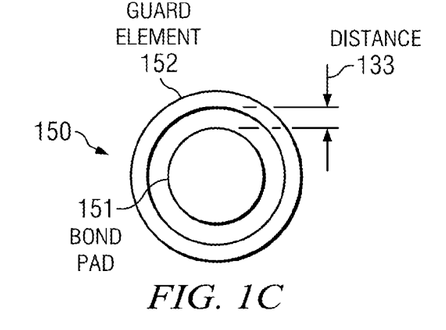

FIG. 1C depicts a wire bond alignment sensing structure 150 that includes a first bond pad 151 shown as a circular bond pad selected from an array of circular bond pads on the semiconductor die, and a guard element 152 that encircles the bond pad 151. Wire bond alignment sensing structure 150 is sensitive to 360 degrees of bond wire misalignment.

Figure 1D:
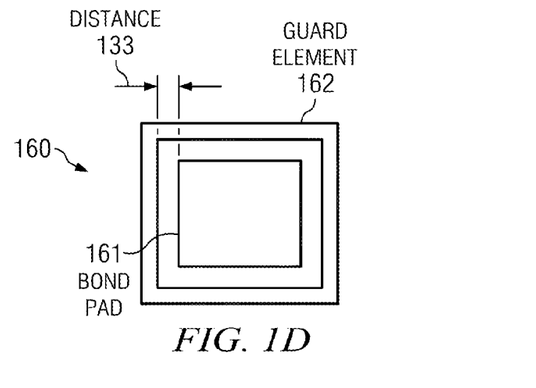

FIG. 1D depicts a wire bond alignment sensing structure 160 that includes a first bond pad 161 shown as a rectangular bond pad 162 selected from an array of rectangular bond pads on the semiconductor die, and a guard element 162 that encircles the first bond pad 161. Wire bond alignment sensing structure 160 is sensitive to 360 degrees of bond wire misalignment.

Figure 1E:
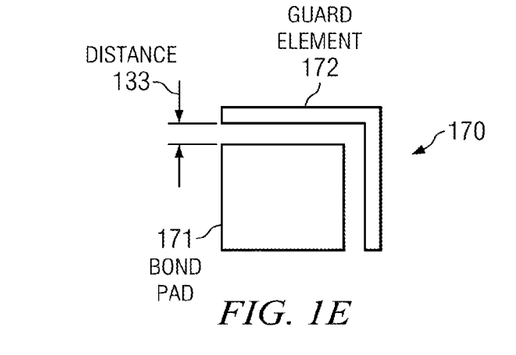

FIG. 1E depicts a wire bond alignment sensing structure 170 that includes a first bond pad 171 shown as a rectangular bond pad selected from an array of rectangular bond pads on the semiconductor die, and a guard element 172 that is oriented along the length of two of the four sides of the first bond pad 171. Wire bond alignment sensing structure 170 is sensitive to 180 degrees of bond wire misalignment.

Figure 2A:
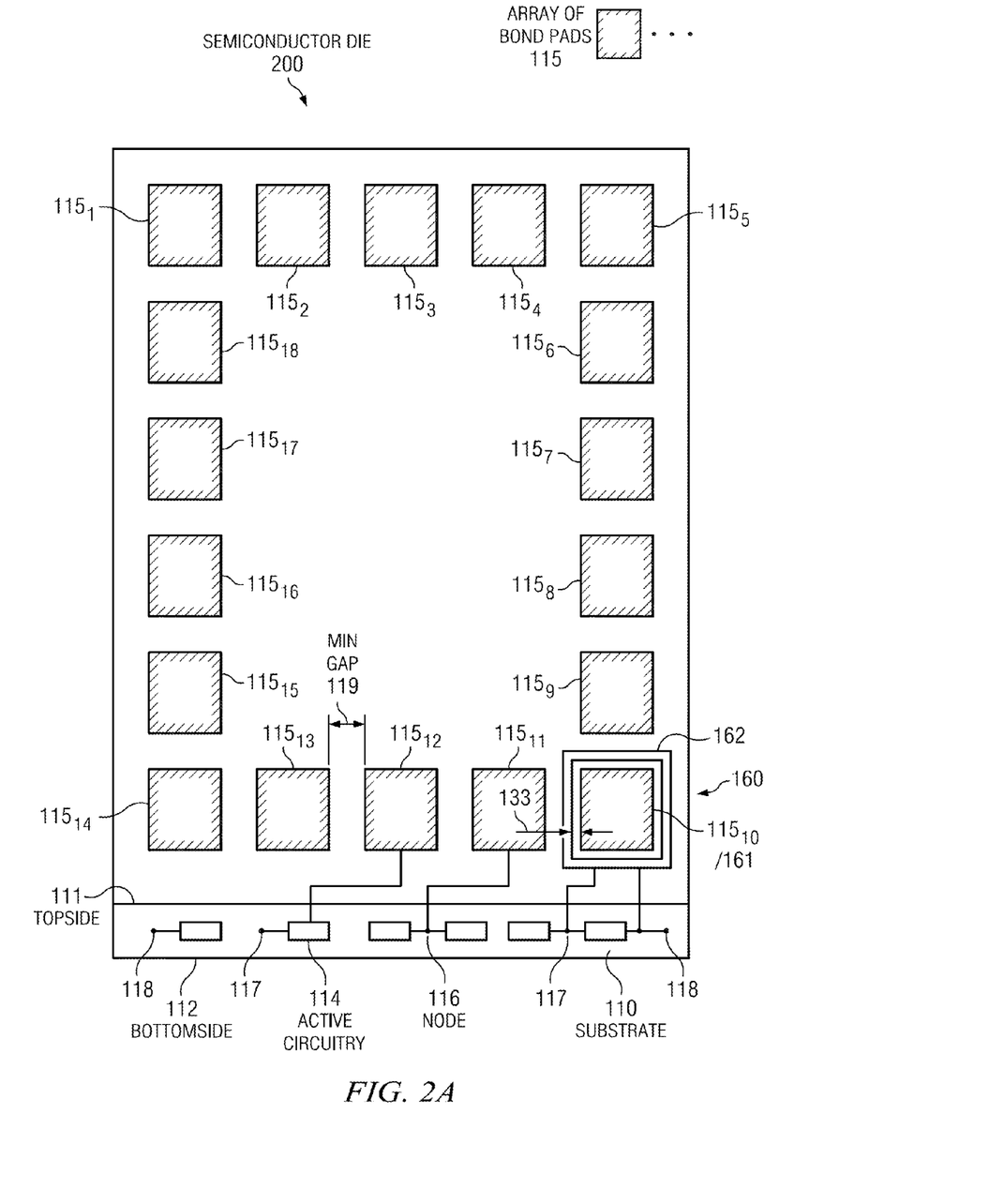
FIG. 2A is an enhanced top perspective depiction of a semiconductor die including a disclosed wire bond alignment sensing structure, according to an example embodiment.

FIG. 2A is an enhanced top perspective depiction of a semiconductor die 200 including a disclosed wire bond alignment sensing structure 160, according to an example embodiment. "Enhanced" as used herein regarding figures refers to the inclusion of depictions of active circuitry 114 and nodes in the active circuitry of the die that would not be viewable from a conventional top view or perspective view of the die. Semiconductor die 200 includes a substrate 110 having a topside 111 including active circuitry 114 having an array of bond pads 115 ($115_1$-$115_{14}$) thereon separated by gaps including a minimum gap ("MIN GAP" in FIG. 2A) 119, and a bottomside 112. At least a portion of the array of bond pads 115 are connected to nodes in the active circuitry, shown as nodes 116, 117, and 118 in FIG. 2A.

In the embodiment shown, bond pad 161 in FIG. 1D is shown as the first bond pad $115_{10}$/161 in the array of bond pads 115, which is an active bond pad that is connected to node 117 in the active circuitry 114, such as a power supply node (e.g., a Vcc or a Vdd node). Guard element 132 encircles first bond pad $115_{10}$/161 and is connected to node 118 in the active circuitry 114. Node 118 may be a ground node. The guard element 132 is spaced apart by a distance 133 that is shorter than the minimum gap 119 from the first bond pad $115_{10}$/161. This embodiment which utilizes one of the bond pads ($115_{10}$/161) in array of bond pads 115 that is connected to the active circuitry 114 allows testing of wire bond alignment sensing structure 160 without the need for any additional bond wire or workpiece contacts (e.g., no extra/dedicated wire bond(s) or extra/dedicated lead(s) for a leaded package).

Figure 2B:
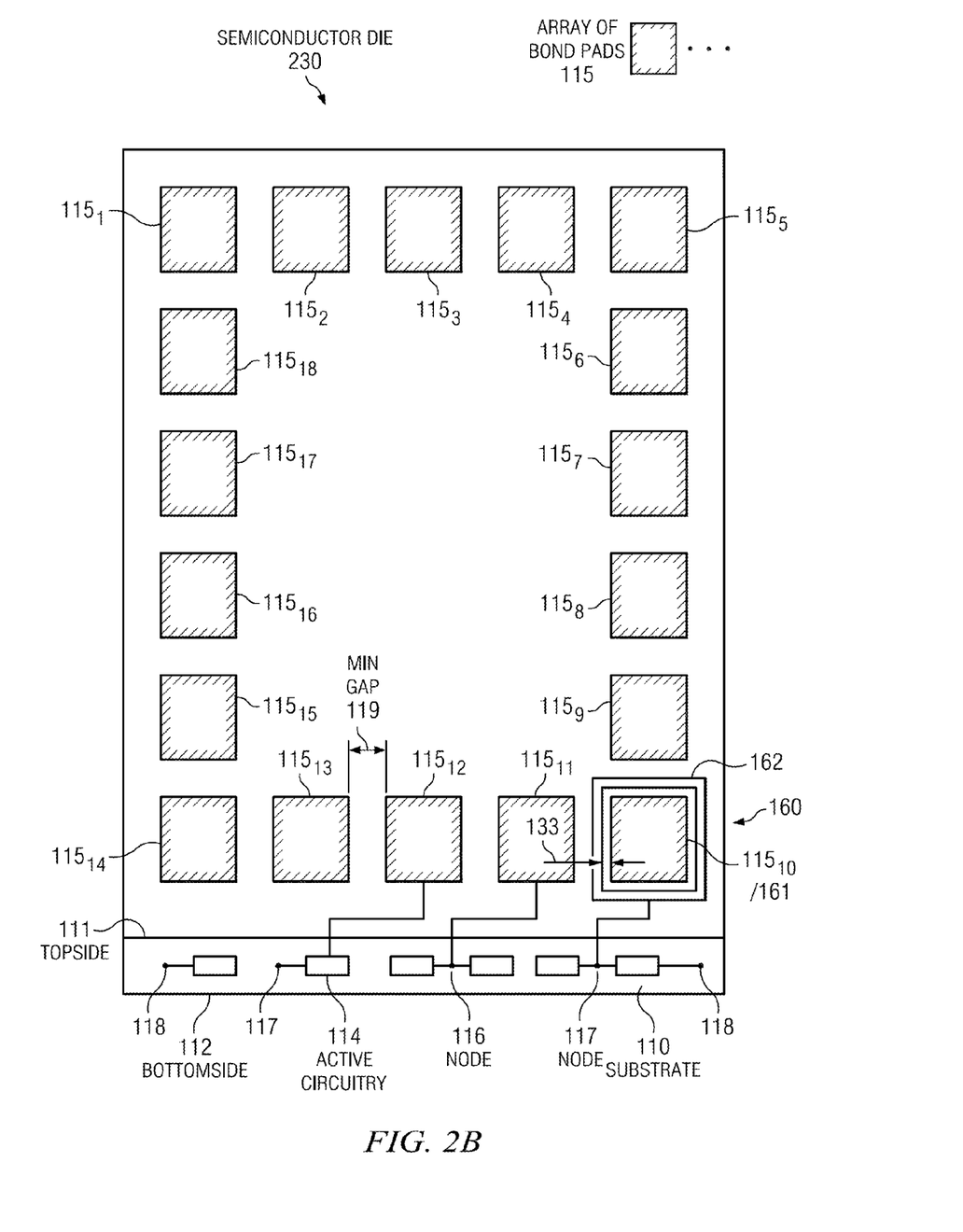
FIG. 2B is an enhanced top perspective depiction of a semiconductor die including a disclosed wire bond alignment sensing structure, according to another example embodiment.

FIG. 2B is an enhanced top perspective depiction of a semiconductor die 230 including the wire bond alignment sensing structure 160 shown in FIG. 1D, according to another example embodiment. In the embodiment shown, the first bond pad $115_{10}$/161 is a floating bond pad (i.e., not connected to any of the nodes in the active circuitry 114). As in FIG. 2A, guard element 162 is connected to a node 118 in the active circuitry 114, such as a ground node. Although a single wire bond alignment sensing structure, such as wire bond alignment sensing structure 160 per die, can be used to sense bond wire misalignments up, down, left or to the right, using a wire bond alignment sensing structure located at the each corner of the die allows the electrical test results to determine the direction of the misalignment without the need to open the package for closed (encapsulated) packages and to also promptly feedback this information to assembly to correct the alignment problem.

Figure 2C:
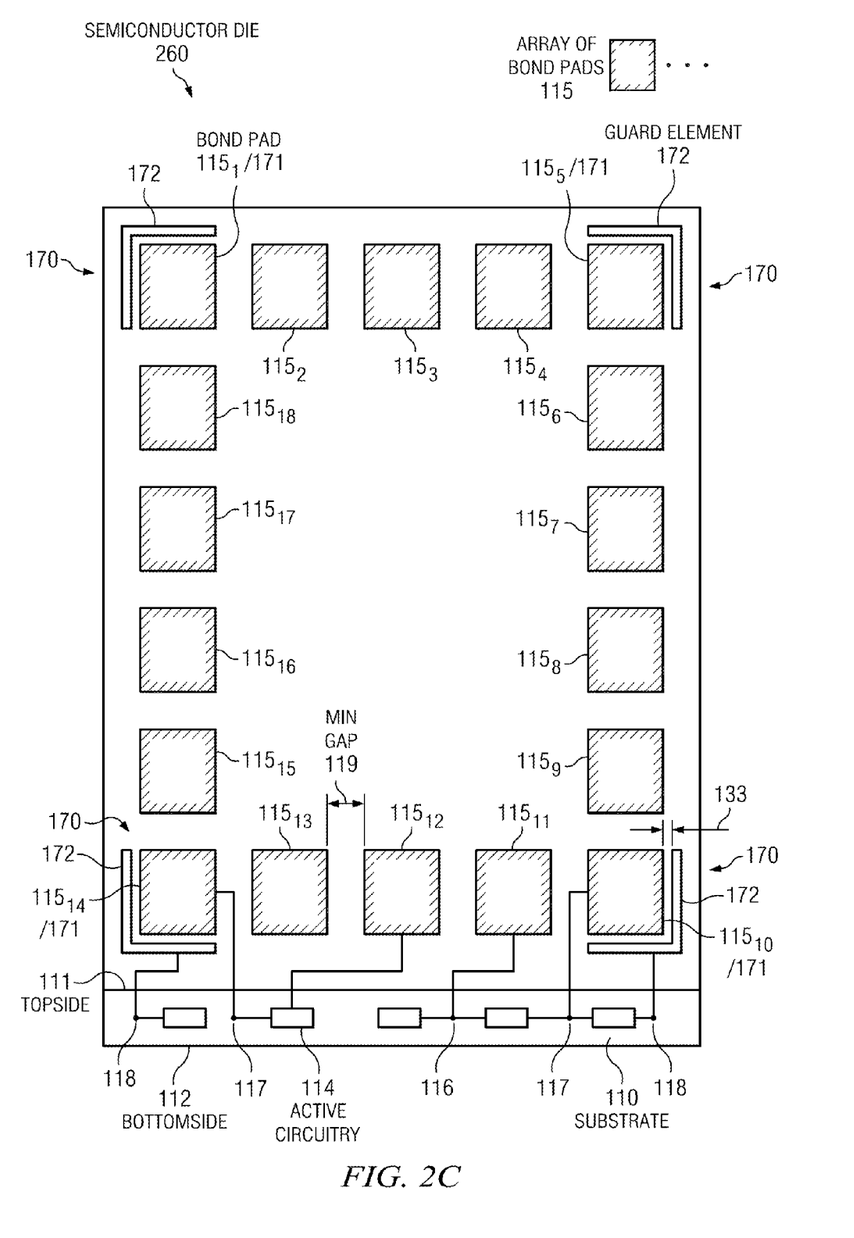
FIG. 2C is an enhanced top perspective depiction of a semiconductor die including a disclosed wire bond alignment sensing structure, according to yet another example embodiment, where the first bond pads are connected to nodes in the active circuitry.

For example, FIG. 2C is an enhanced top perspective depiction of a semiconductor die 260 including the wire bond alignment sensing structures 170 shown in FIG. 1E in each of its four corners, according to yet another example embodiment. The array of bond pads 115 can be seen to be rectangular in shape having four sides, and the guard elements 132 are positioned along two of these sides to frame the semiconductor die 260. The first bond pad is shown as $115_{10}$/171 which is tied to node 117 in the active circuitry 114. The guard elements 172 are connected to a node 118 in the active circuitry 114, such as a ground node.

Semiconductor die 260 having wire bond alignment sensing structures 170 located at the each corner of the die allows the electrical test results to determine the direction of the misalignment (up, down, left or to the right) without the need to open the package for closed (encapsulated) packages and promptly feedback this information to assembly to correct the alignment problem. Although the wire bond alignment sensing structures 170 are positioned on the corners of the die 260 in FIG. 2C, disclosed wire bond alignment sensing structures 170 can be positioned anywhere on the die.

Figure 2D:
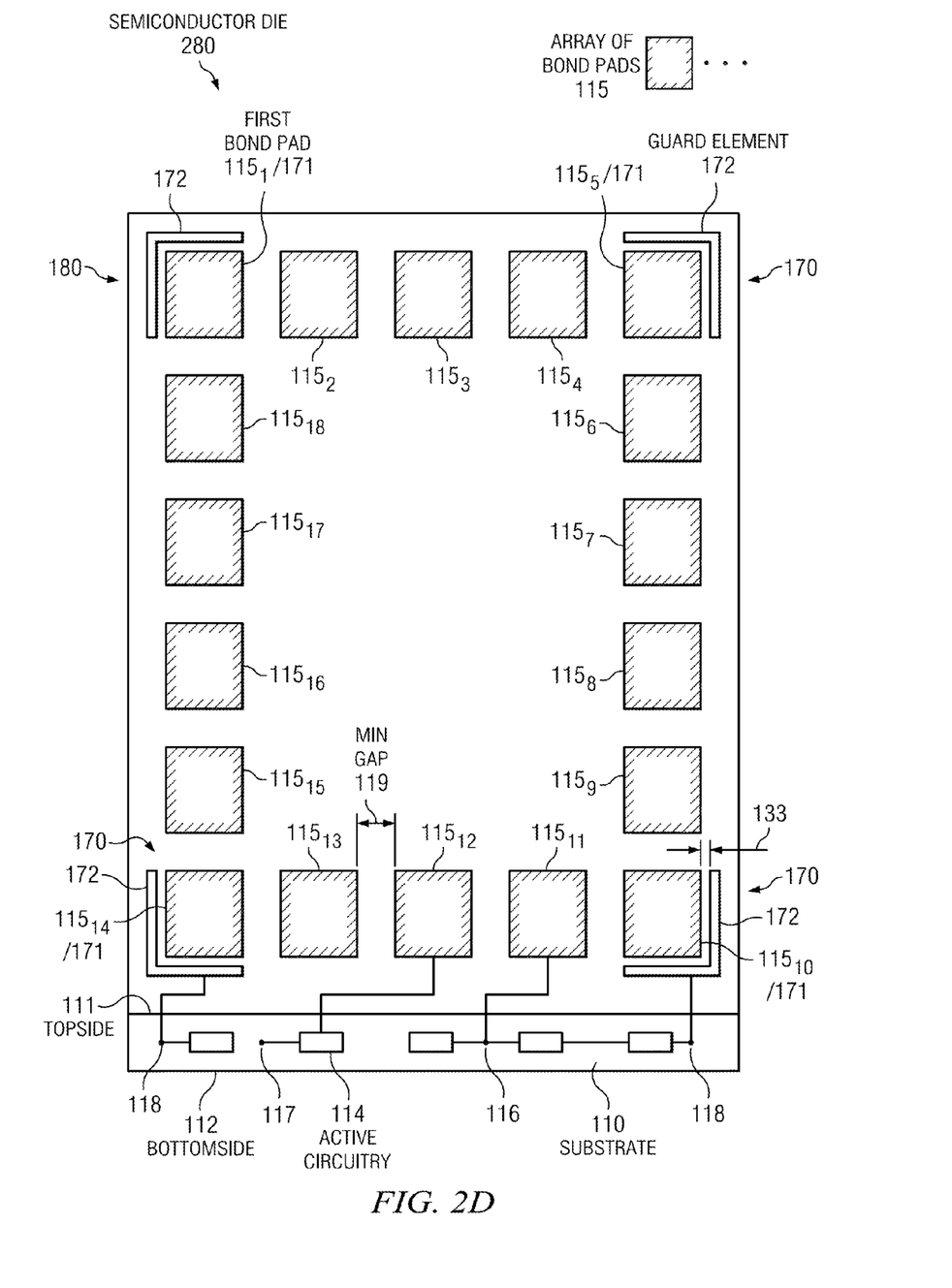
FIG. 2D is an enhanced top perspective depiction of a semiconductor die including the wire bond alignment sensing structures shown in FIG. 1E in each of its corners, where the first bond pads are floating bond pads (unconnected), according to yet another example embodiment.

FIG. 2D is an enhanced top perspective depiction of a semiconductor die 280 including the wire bond alignment sensing structures 170 shown in FIG. 1E in each of its corners, according to yet another example embodiment. In the embodiment shown the first bond pad 171 is a floating bond pad (unconnected). The guard elements 172 are connected to a node 118 in the active circuitry 114, such as a ground node.

FIGS. 3A-D depict how the semiconductor die 260 shown in FIG. 2C (or semiconductor die 280 shown in FIG. 2D) senses wire bond misalignment in the bottom direction, top direction, left direction and right direction, respectively, according to an example embodiment. The round metal features 310 depicted on the bond pads in the array of bond pads 115 represent metal at the bond wire contact area to the bond wire (not shown) together with any plowed metal that may be at or adjacent to the bond wire contact. Round metal features 310 on semiconductor die $260_1$ in FIG. 3A can be seen to sense misalignment in the bottom direction by creating a short between bond pad $115_{10}$/171 and its guard element 172 and bond pad $115_{14}$/171 and its guard element 172, but not a short between bond pad $115_1$/171 and its guard element 172 or bond pad $115_5$/171 and its guard element 172. Round metal features 310 on die $260_2$ in FIG. 3B can be seen to sense misalignment in the top direction by creating a short between bond pad $115_1$/171 and its guard element 172 and bond pad $115_5$/171 and its guard element 172, but not between bond pad $115_{10}$/171 and its guard element 172 or bond pad $115_{14}$/171 and its guard element 172.

Figure 3A:
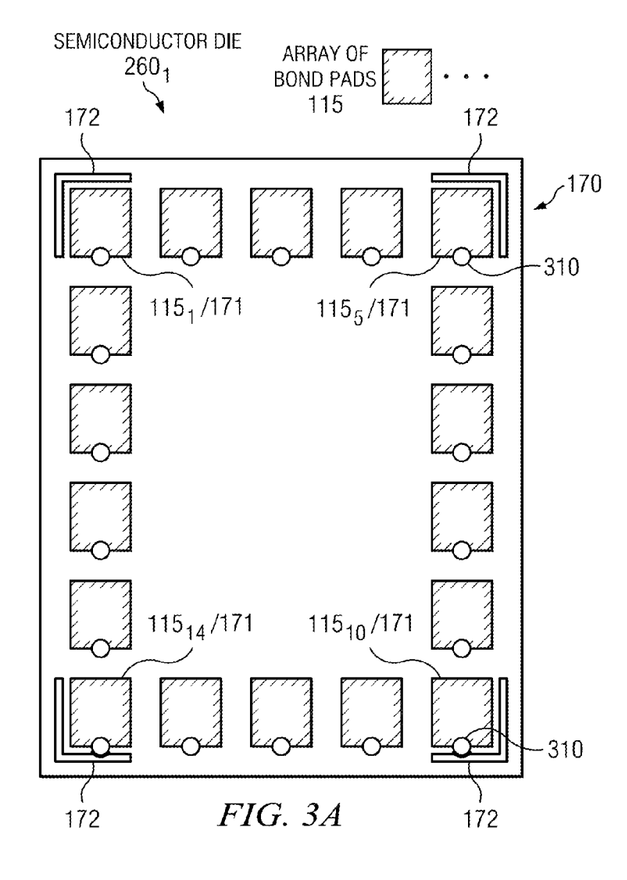
FIGS. 3A-D depict the semiconductor die shown in FIG. 2C sensing wire bonds misaligned in the bottom direction, top direction, left direction and right direction, respectively, according to an example embodiment.
Figure 3B:
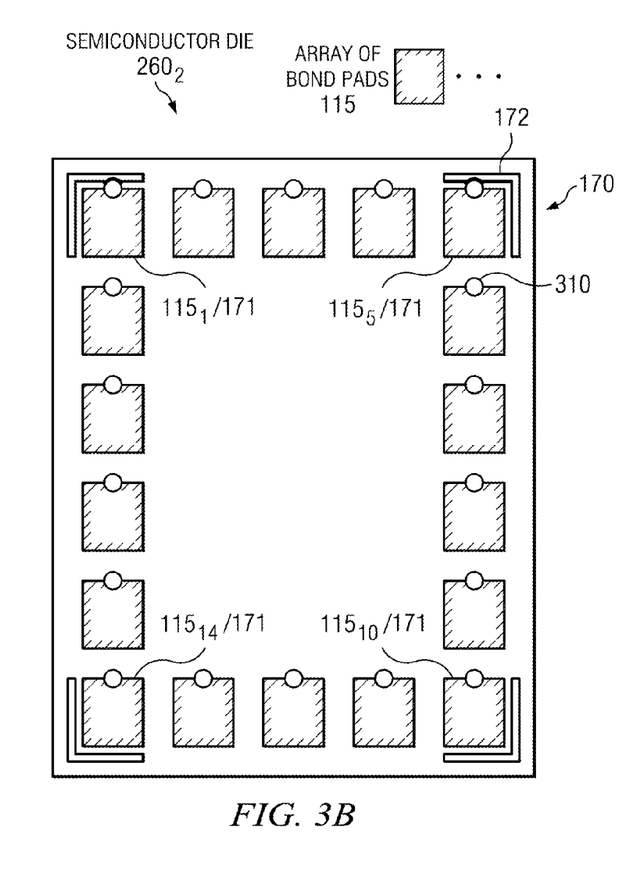
Figure 3C:
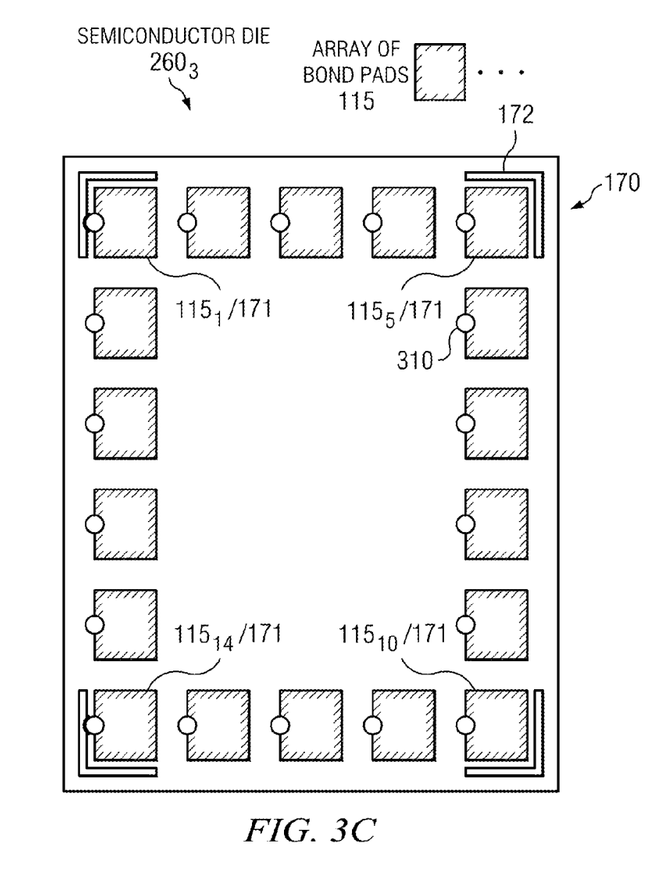
Figure 3D:
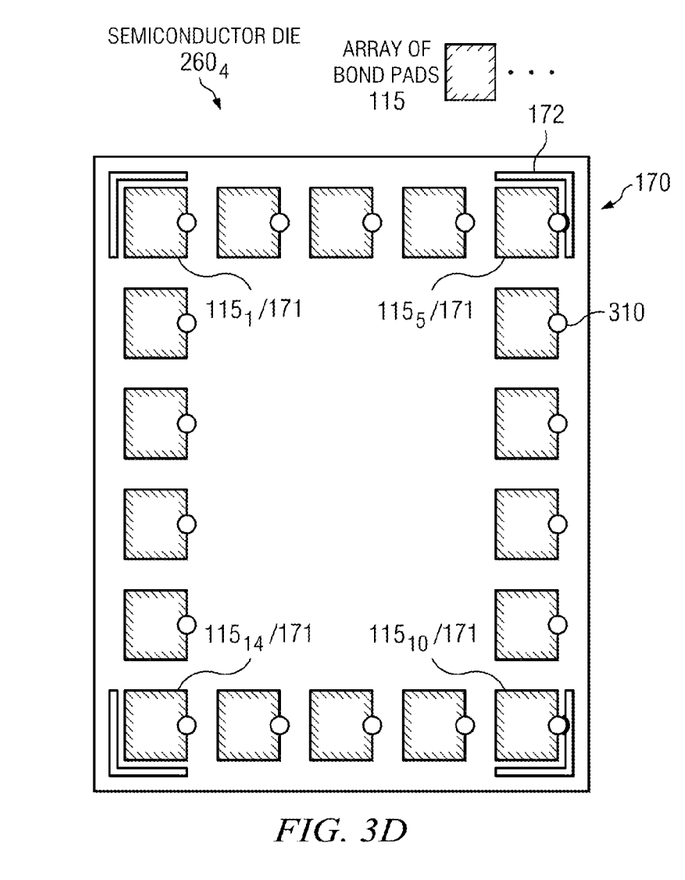

Round metal features 310 on die $260_3$ in FIG. 3C can be seen to sense misalignment in the left direction by creating a short between bond pad $115_1$/171 and its guard element 172, and bond pad $115_{14}$/171 and its guard element 172, but not between bond pad $115_5$/171 and its guard element 172, or bond pad $115_{10}$/171 and its guard element 172. Round metal features 310 on die $260_4$ in FIG. 3D can be seen to create a short between bond pad $115_5$/171 and its guard element 172 and bond pad $115_{10}$/171 and its guard element 172, but not between bond pad $115_1$/171 and its guard element 172 or bond pad $115_{14}$/171 and its guard element. Those having ordinary skill in the art will recognize bond wire misalignments that having components on two axes, such as misalignment up and to the left, or down and to the right, may create shorts on three corners semiconductor die 260.

Disclosed semiconductor die having wire bond alignment sensing structures can be wire bonded to a variety of different workpieces. For example, the workpiece can comprise an organic or ceramic substrate (e.g., printed circuit board (PCB)), a die or a die stack, or a lead frame for a leaded or leadless package.

Figure 4A:
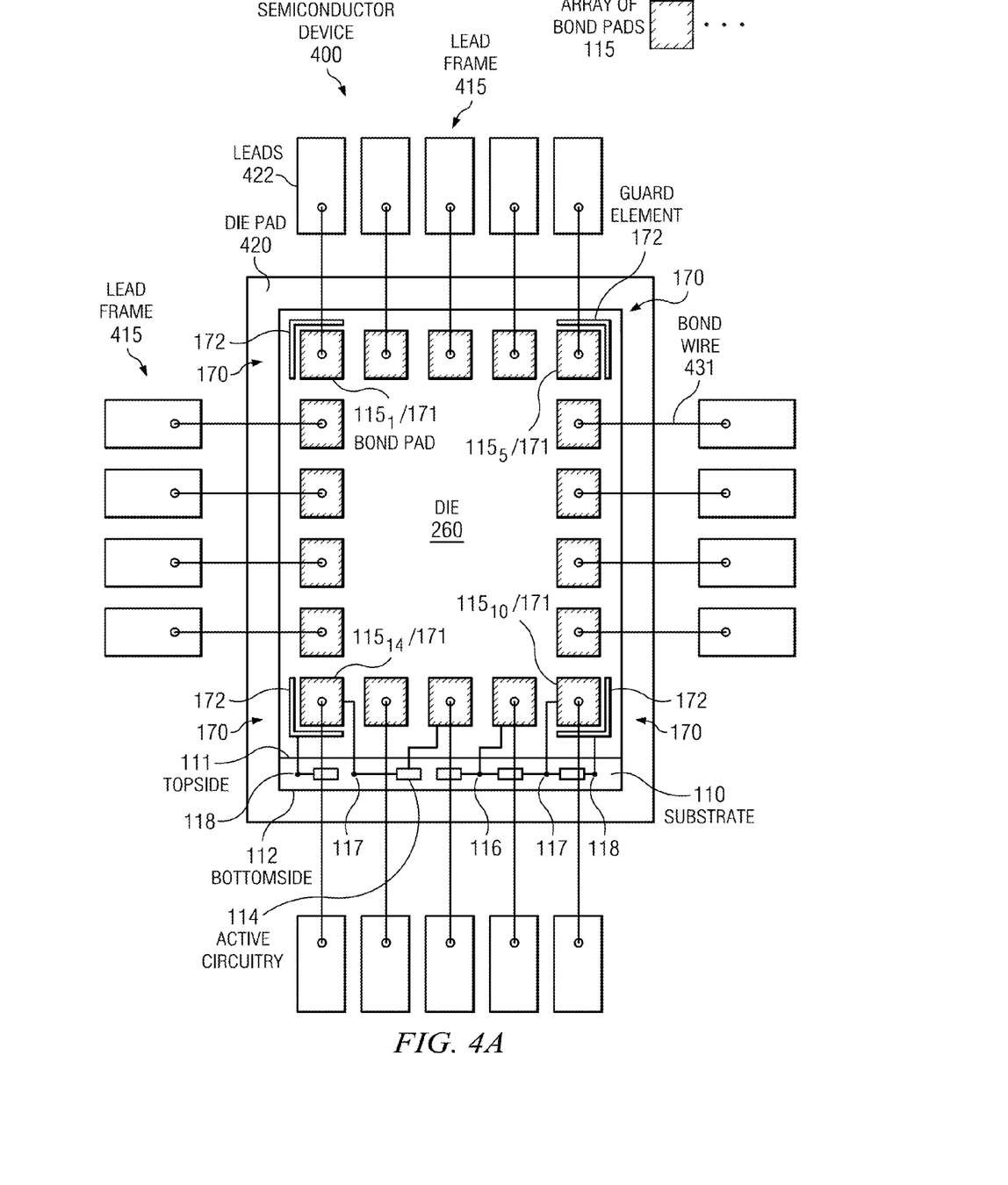
FIG. 4A is an enhanced top perspective depiction of a wire bonded lead frame-based semiconductor device including a disclosed semiconductor die having at least one disclosed wire bond alignment sensing structure wire bound to the leadframe, according to an example embodiment.

FIG. 4A is an enhanced top perspective depiction of a wire bonded lead frame-based semiconductor device 400 including a disclosed semiconductor die 260 having wire bond alignment sensing structures 170 on a die pad 420 of a lead frame 415 wire bonded by bond wires 431 to leads or pins 422 of the lead frame 415. Since the bond pads $115_1$/171, $115_5$/171, $115_{10}$/171 and $115_{14}$/171 in array of bond pads 115 and their associated guard elements 172 in wire bond alignment sensing structures 170 are all connected to nodes in the active circuitry 114 on the semiconductor die 260, wire bond alignment sensing structures 170 may be tested without the need for any dedicated bond wires 431 or dedicated leads or pins 422.

Figure 4B:
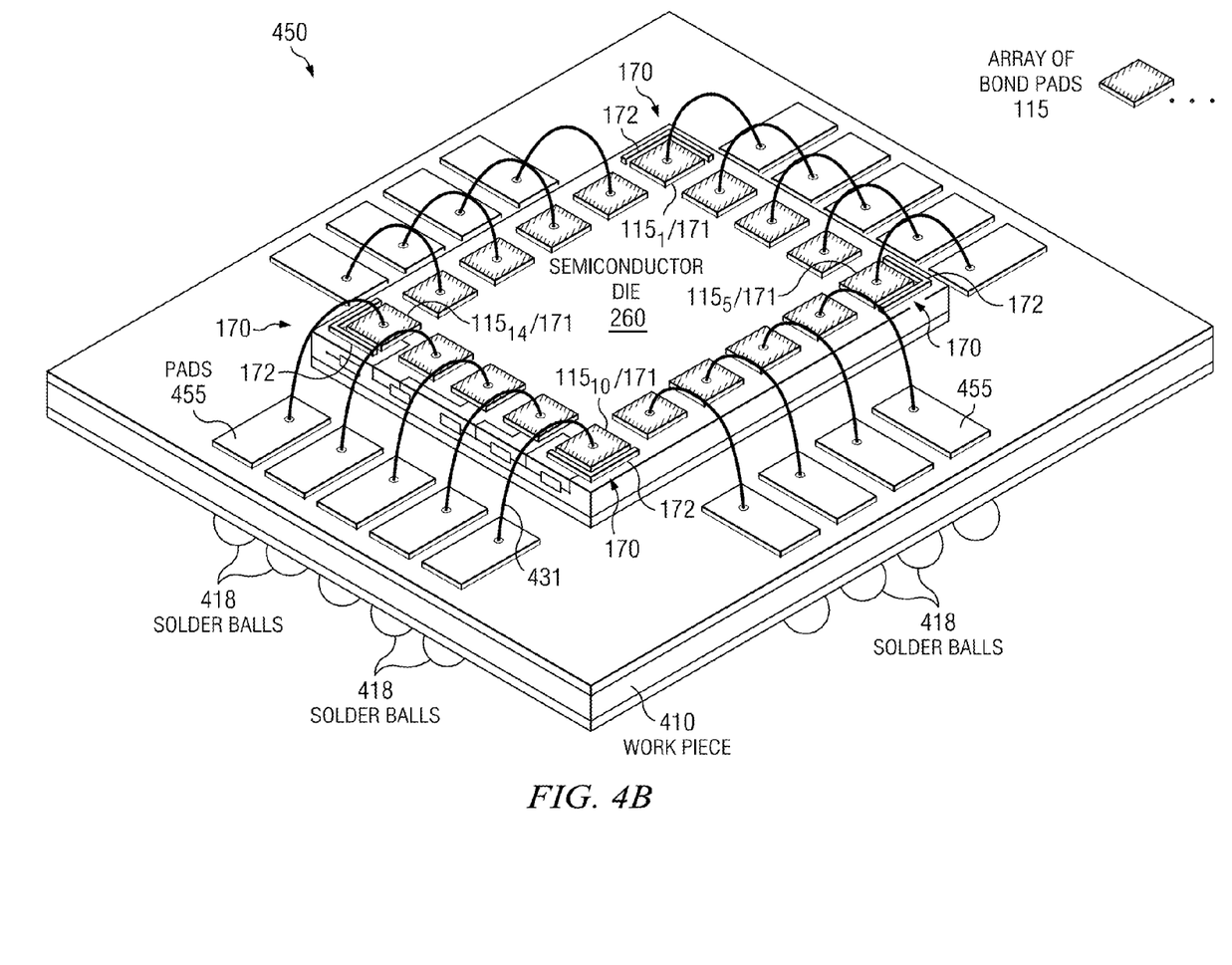
FIG. 4B is an enhanced top perspective depiction of a wire bonded laminate substrate-based semiconductor device including a disclosed semiconductor die having at least one disclosed wire bond alignment sensing structure wire bound to the laminate substrate, according to an example embodiment.

FIG. 4B is an enhanced top perspective depiction of a wire bonded laminate substrate-based semiconductor device 450 including a disclosed semiconductor die 260 having wire bond alignment sensing structures 170 on a workpiece 410 shown as a laminate substrate 410, according to an example embodiment. Bond pads in array of bond pads 115 on die 260 are connected by bond wires 431 to contact pads 455 on the frontside of the laminate substrate 410. Laminate substrate 410 has a BGA comprising solder balls 418 on its backside. As with semiconductor device 400 shown in FIG. 4A, since the bond pads $115_1$/171, $115_5$/171, $115_{10}$/171 and $115_{14}$/171 and their associated guard elements 172 of the wire bond alignment sensing structures 170 on semiconductor die 260 shown in FIG. 4B are all connected to nodes in the active circuitry 114 on the semiconductor die 260, the wire bond alignment sensing structures 170 may be tested without the need for any dedicated bond wires 431 or dedicated contact pads 455.

Disclosed semiconductor die having wire bond alignment sensing structures may also be used before wirebonding. For example, during wafer level multiprobe (MP), disclosed wire bond alignment sensing structures can be used for probe needle alignment of the probe card. As known during MP wafer test, when the probe card is misaligned relative to the bond pads on the die, the probe card needles of the probe card can touch the edge of the bond pads, and the test result may still be acceptable. However, the probe needle's pad edge contact can cause bond pad damage and make a probe mark outside of the bond pad, such as snowplowed metal that can short (or nearly short) to a neighboring bond pad. In the case of excessive misalignment, the probe needle tips may scrub over the active circuit area which can scrape through the passivation and result in damage to the die sufficient to result in functional circuit failures. By using die having disclosed wire bond alignment sensing structures, such as a bond alignment sensing structure on each corner of the die (e.g., die 260 shown in FIG. 2C), misalignment of probe card's needle can be detected (e.g., as a short when the probe needle creates a short between the bond pad and the guard element in the wire bond alignment sensing structures) and the direction of misalignment identified. This position information obtained can be used to realign the probe card so that the probe needles are moved to contact near the center of the bond pads.

Disclosed embodiments can be integrated into a variety of assembly flows to form a variety of different integrated circuit (IC) devices and related products. The IC assembly can comprise single semiconductor die or multiple semiconductor die, such as PoP configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

I claim:

1. A semiconductor die, comprising:
a substrate having a topside including active circuitry having an array of bond pads thereon separated by gaps including a minimum gap, wherein at least a portion of said array of bond pads are connected to nodes in said active circuitry, and
at least one wire bond alignment sensing structure, including:
a first bond pad selected from said array of bond pads, and
a guard element positioned along at least a portion of said first bond pad,
wherein said guard element is spaced apart by a distance shorter than said minimum gap from said first bond pad.

2. The semiconductor die of claim 1, wherein said guard element is connected to a first node of said nodes in said active circuitry, wherein said first bond pad is connected to a second node in said active circuitry, and wherein said first node is not connected to a second node.

3. The semiconductor of claim 2, wherein said first node is a ground node of said active circuitry.

4. The semiconductor of claim 2, wherein said second node is a power supply node of said active circuitry.

5. The semiconductor die of claim 1, wherein said first bond pad is a floating bond pad that is not connected to any of said nodes in said active circuitry.

6. The semiconductor die of claim 1, wherein said guard element and said array of bond pads share a common metal level.

7. The semiconductor die of claim 1, wherein said semiconductor die has four corners, and wherein one of said plurality of wire bond alignment sensing structures is positioned in each of said corners.

8. The semiconductor die of claim 7, wherein said array of bond pads are rectangular in shape having a plurality of sides, and wherein said guard element is positioned along two of said plurality of sides to frame said semiconductor die.

9. A wire bonded semiconductor device, comprising:
a semiconductor die, including:
 a substrate having a topside including active circuitry having an array of bond pads thereon separated by gaps including a minimum gap, wherein at least a portion of said array of bond pads are connected to nodes in said active circuitry, and
 at least one wire bond alignment sensing structure, including:
  a first bond pad selected from said array of bond pads, and
  a guard element positioned along at least a portion of said first bond pad, wherein said guard element is spaced apart by a distance shorter than said minimum gap from said first bond pad;
 a workpiece having a plurality of pads, leads or pins, and
 bond wires coupling said array of bond pads to said plurality of pads, leads or pins on said workpiece.

10. The wire bonded semiconductor device of claim 9, wherein said workpiece comprises a lead frame or a laminate substrate.

11. The wire bonded semiconductor device of claim 9, wherein said guard element is connected to a first node of said nodes in said active circuitry, wherein said first bond pad is connected to a second node in said active circuitry, and wherein said first node is not connected to a second node.

12. The wire bonded semiconductor device of claim 11, wherein said first node is a ground node of said active circuitry.

13. The wire bonded semiconductor device of claim 11, wherein said second node is a power supply node of said active circuitry.

14. The wire bonded semiconductor device of claim 11, wherein said first bond pad is a floating bond pad that is not connected to any of said nodes in said active circuitry.

15. The wire bonded semiconductor device of claim 11, wherein said semiconductor die has four corners, and wherein one of said plurality of wire bond alignment sensing structures is positioned in each of said corners.

16. The wire bonded semiconductor device of claim 11, wherein said array of bond pads are rectangular in shape having a plurality of sides, and wherein said guard element is positioned along two of said plurality of sides to frame said semiconductor die.

17. A method of testing wire bonded semiconductor devices, comprising:
 providing a wire bonded semiconductor device including (i) a semiconductor die having an array of bond pads thereon separated by gaps including a minimum gap and at least one wire bond alignment sensing structure including a first bond pad selected from said array of bond pads, and a guard element positioned along at least a portion of said first bond pad, wherein said guard element is spaced apart by a distance shorter than said minimum gap from said first bond pad, and (ii) a workpiece having contact pads, leads or pins, wherein said semiconductor device is on said workpiece and wire bonds couple said array of bond pads to said contact pads, leads, or pins, and
 automatically electrically testing said electronic assembly including obtaining test data from said wire bond alignment sensing structure.

18. The method of claim 17, wherein said semiconductor die has four corners, and wherein one of said plurality of wire bond alignment sensing structures is positioned in each of said corners.

19. The method of claim 18, wherein said test data from said electrically testing indicates a direction of bond wire misalignment, and wherein said direction of bond wire misalignment is used to change at least one bond wire assembly parameter to reduce a magnitude of said bond wire misalignment.

20. The method of claim 17, wherein said guard element is connected to a first node of said nodes in said active circuitry, wherein said first bond pad is connected to a second node in said active circuitry, and wherein said first node is not connected to a second node.

* * * * *